United States Patent
Miao et al.

(10) Patent No.: US 10,910,372 B2
(45) Date of Patent: Feb. 2, 2021

(54) FIN FIELD EFFECT TRANSISTOR DEVICES WITH MODIFIED SPACER AND GATE DIELECTRIC THICKNESSES

(71) Applicant: INTERNATIONAL BUSINESS MACHINES CORPORATION, Armonk, NY (US)

(72) Inventors: Xin Miao, Guilderland, NY (US); Kangguo Cheng, Schenectady, NY (US); Wenyu Xu, Albany, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/675,890

(22) Filed: Nov. 6, 2019

(65) Prior Publication Data

US 2020/0075589 A1 Mar. 5, 2020

Related U.S. Application Data

(62) Division of application No. 16/003,838, filed on Jun. 8, 2018, now Pat. No. 10,529,713.

(51) Int. Cl.
*H01L 27/088* (2006.01)
*H01L 29/66* (2006.01)
(Continued)

(52) U.S. Cl.
CPC ........ *H01L 27/0886* (2013.01); *H01L 21/762* (2013.01); *H01L 21/823431* (2013.01); *H01L 29/66795* (2013.01); *H01L 29/785* (2013.01)

(58) Field of Classification Search
CPC ............... H01L 27/0886; H01L 21/762; H01L 21/823431
See application file for complete search history.

(56) References Cited

U.S. PATENT DOCUMENTS

| 8,637,849 B2 | 1/2014 | Deligianni et al. |
| 8,809,139 B2 | 8/2014 | Huang et al. |

(Continued)

OTHER PUBLICATIONS

Yakimets et al., "Vertical GAAFETs for the Ultimate CMOS Scaling", IEEE Transactions on Electron Devides, vol. 62, Issue 5. May 2015. pp. 1433-1439.

(Continued)

*Primary Examiner* — Marc Anthony Armand
(74) *Attorney, Agent, or Firm* — Tutunjian & Bitetto, P.C.; Randall Bluestone

(57) ABSTRACT

A method of forming fin field effect devices is provided. The method includes forming a plurality of vertical fins on a substrate. The method further includes forming a dielectric pillar on the substrate between two adjacent vertical fins, wherein at least one of the vertical fins is on a first region of the substrate, and at least one of the vertical fins is on a second region of the substrate. The method further includes growing a bottom source/drain layer on the first region of the substrate and the second region of the substrate. The method further includes depositing a bottom spacer layer on the bottom source/drain layer, and a filler layer on the bottom spacer layer. The method further includes forming a cover block on the first region of the substrate, and removing the portion of the filler layer on the second region of the substrate.

20 Claims, 7 Drawing Sheets

(51) Int. Cl.
*H01L 21/8234* (2006.01)
*H01L 21/762* (2006.01)
*H01L 29/78* (2006.01)

(56) References Cited

U.S. PATENT DOCUMENTS

| | | |
|---|---|---|
| 9,252,233 B2 | 2/2016 | Hsiao et al. |
| 9,437,503 B1 | 9/2016 | Mallela et al. |
| 9,564,434 B2 | 2/2017 | Zhu |
| 9,627,511 B1 | 4/2017 | Cheng et al. |
| 9,647,123 B1 | 5/2017 | Balakrishnan et al. |
| 9,711,618 B1 | 7/2017 | Cheng et al. |
| 9,853,028 B1 | 12/2017 | Cheng et al. |
| 2017/0054027 A1 | 2/2017 | Liu |
| 2018/0005904 A1 | 1/2018 | Lee et al. |
| 2018/0006025 A1 | 1/2018 | Hook et al. |
| 2019/0198400 A1* | 6/2019 | Miao .................. H01L 21/82346 |
| 2019/0304841 A1* | 10/2019 | Sung .................. H01L 21/82382 |

OTHER PUBLICATIONS

List of IBM Patents or Patent Applications Treated as Related dated Nov. 6, 2019, 2 pages.

\* cited by examiner

FIN FIELD EFFECT TRANSISTOR DEVICES WITH MODIFIED SPACER AND GATE DIELECTRIC THICKNESSES

BACKGROUND

Technical Field

The present invention generally relates to fin field effect transistor (FinFET) devices, and more particularly to modified gate structures for FinFET devices.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming fin field effect devices is provided. The method includes forming a plurality of vertical fins on a substrate. The method further includes forming a dielectric pillar on the substrate between two adjacent vertical fins of the plurality of vertical fins, wherein at least one of the plurality of vertical fins is on a first region of the substrate, and at least one of the plurality of vertical fins is on a second region of the substrate. The method further includes growing a bottom source/drain layer on the first region of the substrate and the second region of the substrate. The method further includes depositing a bottom spacer layer on the bottom source/drain layer, and depositing a filler layer on the bottom spacer layer. The method further includes forming a cover block on the first region of the substrate, and removing the portion of the filler layer on the second region of the substrate.

In accordance with another embodiment of the present invention, a method of forming fin field effect devices is provided. The method includes forming a plurality of vertical fins on a substrate. The method further includes forming a dielectric pillar on the substrate between two adjacent vertical fins of the plurality of vertical fins, wherein at least one or the plurality of vertical fins is on a first region of the substrate, and at least one of the plurality of vertical fins is on a second region of the substrate. The method further includes growing a bottom source/drain layer on the first region of the substrate and the second region of the substrate, and depositing a bottom spacer layer on the bottom source/drain layer. The method further includes depositing a filler layer on the bottom spacer layer, and forming a cover block on the first region of the substrate. The method further includes removing the portion of the filler layer on the second region of the substrate, and depositing a first gate dielectric layer on the bottom spacer layer on the second region of the substrate. The method further includes depositing a first conductive gate fill layer on the first gate dielectric layer. The method further includes removing the cover block, and depositing a second gate dielectric layer on the filler layer on the first region of the substrate, wherein the first gate dielectric layer is about 2 nm to about 6 nm thicker than the second gate dielectric layer.

In accordance with yet another embodiment of the present invention, a plurality of fin field effect devices is provided. The plurality of fin field effect devices includes at least one vertical fin on a first region of a substrate, and at least one vertical fin on a second region of the substrate. The plurality of fin field effect devices further includes a bottom spacer layer on the first region of the substrate and the second region of the substrate, and a filler layer on the bottom spacer layer on the first region of the substrate. The plurality of fin field effect devices further includes a first gate dielectric layer on the bottom spacer layer on the second region of the substrate, and a second gate dielectric layer on the filler layer on the first region of the substrate, wherein the first gate dielectric layer is about 2 nm to about 6 nm thicker than the second gate dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate generally to forming vertical transport fin field effect transistors (VT FinFETs) with different gate structure dimensions adjacent to each other on a substrate. The VT FinFETs can have gate structures with gate dielectric layers having different thicknesses, and different gate lengths. The thickness of a filler layer can compensate for the differences in thickness between thick and thin gate dielectric layers to allow the same gate structure height and junction profiles along with the different gate dielectric layer thicknesses.

Embodiments of the present invention relate generally to forming a gate dielectric layer on a first subset of vertical fins having a thickness less than a gate dielectric layer formed on a second subset of vertical fins.

Embodiments of the present invention relate generally to forming VT FinFETs with thicker gate dielectric layers to handle higher drain voltages than voltages otherwise used for logic or memory transistor devices.

Embodiments of the present invention relate generally to avoiding underlap of a gate structure with the top and bottom source/drain junctions by compensating for differences in the gate dielectric layer thicknesses using a filler layer. The filler layer can provide a double-layered bottom spacer for a VT FinFET device having a thinner gate dielectric layer.

Exemplary applications/uses to which the present invention can be applied include, but are not limited to: input/output devices, analog devices, high voltage devices, and digital circuits.

It is to be understood that aspects of the present invention will be described in terms of a given illustrative architecture; however, other architectures, structures, substrate materials and process features and steps can be varied within the scope of aspects of the present invention.

Figure 1:
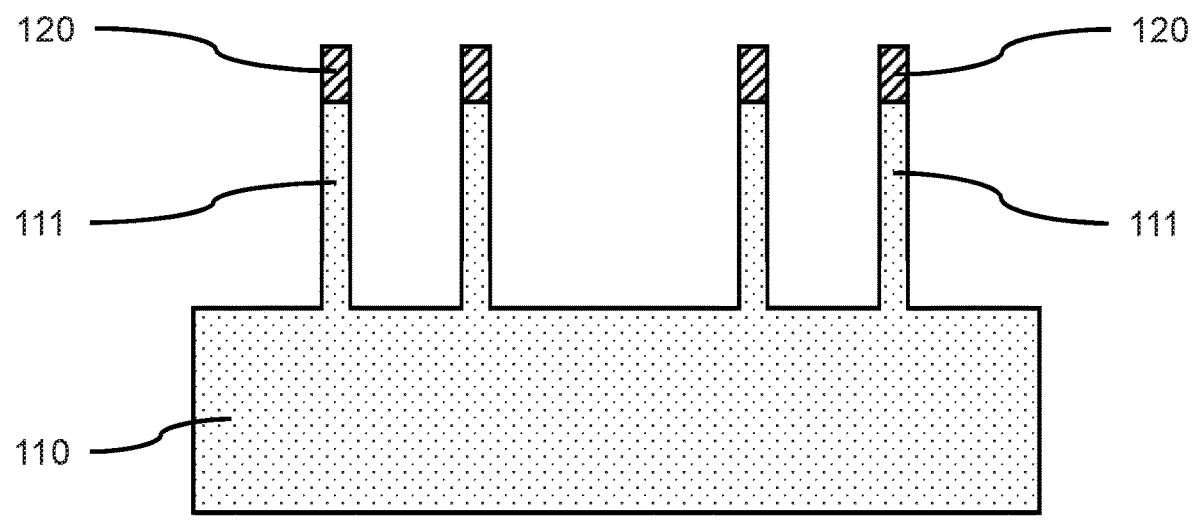
FIG. 1 is a cross-sectional side view showing a plurality of vertical fins on a substrate, in accordance with an embodiment of the present invention.

Referring now to the drawings in which like numerals represent the same or similar elements and initially to FIG. 1, a plurality of vertical fins on a substrate is shown, in accordance with an embodiment of the present invention.

In various embodiments, a substrate 110 can be, for example, a single crystal semiconductor material wafer or a semiconductor-on-insulator stacked wafer. The substrate can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)).

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g., glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The wafer or active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

The insulating layer can be, for example, a buried oxide (BOX) layer (e.g., $SiO_2$) or an implanted layer forming a buried insulating material.

In one or more embodiments, a plurality of vertical fins 111 can be formed on the substrate 110, where the vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins may be formed by a direct write process or double patterning process using, for example, immersion lithography, extreme ultraviolet lithography, or x-ray lithography.

In various embodiments, a fin template 120 may be on each vertical fin 111, where the fin template 120 is formed during the patterning process. The fin templates 120 can be a hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), or combinations thereof. A thin (i.e., <1 nm) oxide layer can be between the top surface of the vertical fin 111 and the fin template 120.

In various embodiments, the plurality of vertical fins 111 can have a center-to-center distance (i.e., fin pitch) in a range of about 15 nanometers (nm) to about 50 nm, or about 20 nm to about 40 nm, although other distances are also contemplated. In various embodiments, laterally adjacent vertical fins 111 can be separated by an integer multiple (e.g., 2×, 3×, etc.) of the center-to-center distance (i.e., fin pitch) by removing one or more intervening vertical fin(s) through a fin cut process.

In various embodiments, the vertical fins 111 can have a thickness in a range of about 3 nm to about 20 nm, or about 5 nm to about 10 nm, although other thicknesses are also contemplated.

Figure 2:
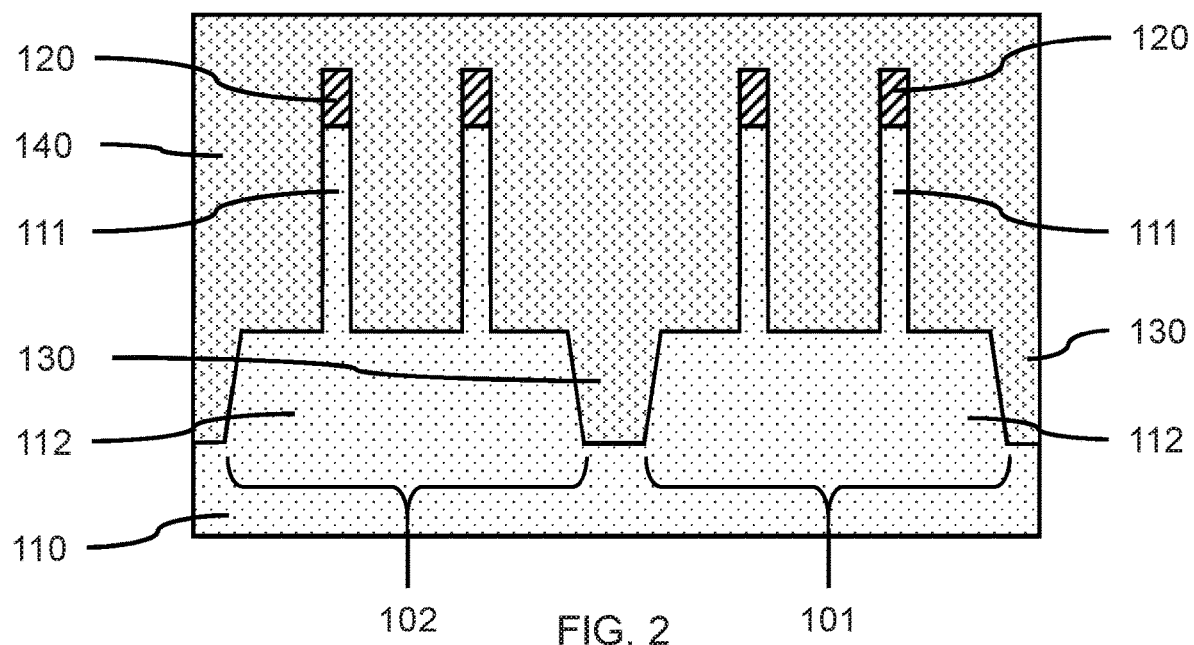
FIG. 2 is a cross-sectional side view showing isolation trenches formed in the substrate between vertical fins, and a dielectric fill layer formed in the trenches and on the vertical fins, in accordance with an embodiment of the present invention.

FIG. 2 is a cross-sectional side view showing isolation trenches formed in the substrate between vertical fins, and a dielectric fill layer formed in the trenches and on the vertical fins, in accordance with an embodiment of the present invention.

In various embodiments, isolation trenches 130 can be formed in the substrate 110 through a lithographic masking and etching process. The formation of the isolation trenches 130 can create mesas 112 on which the vertical fins 111 stand. One or more of vertical fins 111 can be on each mesa 112. Two mesas 112 can be adjacent to each other, and separated by an isolation trench 130.

In one or more embodiments, a dielectric fill layer 140 can be formed in the isolation trenches 130 and on the mesas 112 and vertical fins 111. The dielectric fill layer 140 can be formed by a non-directional, blanket deposition, for example, chemical vapor deposition (CVD) plasma enhanced CVD (PECVD), a spin-on process, or a combination thereof. Portions of the dielectric fill layer 140 that extend above the tops surfaces of the fin templates 120 can be removed using chemical-mechanical polishing (CMP) to provide a smooth, flat surface.

In various embodiments, the dielectric fill layer 140 can be an insulating, dielectric material, for example, silicon oxide (SiO), silicon nitride (SiN), a low-k dielectric material, or combinations thereof. A low-K dielectric can include amorphous carbon (a-C), fluorine doped silicon oxide (SiO:F), carbon doped silicon oxide (SiO:C), SiCOH, silicon boro carbonitride (SiBCN), silicon oxycarbonitride (SiOCN), or a combination thereof.

In one or more embodiments, the dielectric filled isolation trench 130 can be a shallow trench isolation (STI) region, where the isolation region can prevent or reduce electrical conduction between different mesas 112. The isolation trench 130 can have a width of at least 20 nm, or at least 50 nm, or at least 100 nm, or about 20 nm to about 250 nm, or about 50 nm to about 250 nm, or about 100 nm to about 150 nm, to physically and electrically separate adjacent regions of the substrate 110 into, for example, a first region 101 and a second region 102. The isolation trench 130 can be between adjacent vertical fins 111 after a fin cut process removes one or more intervening vertical fins. A plurality of vertical fins 111 can be formed on the substrate 110, where one or more vertical fins 111 formed in the first region 101 can be configured to form an n-type fin field effect transistor (FinFET), and one or more vertical fins 111 formed in the second region 102 can be configured to form a p-type FinFET, although the arrangement and/or dopant type can be reversed.

Figure 3:
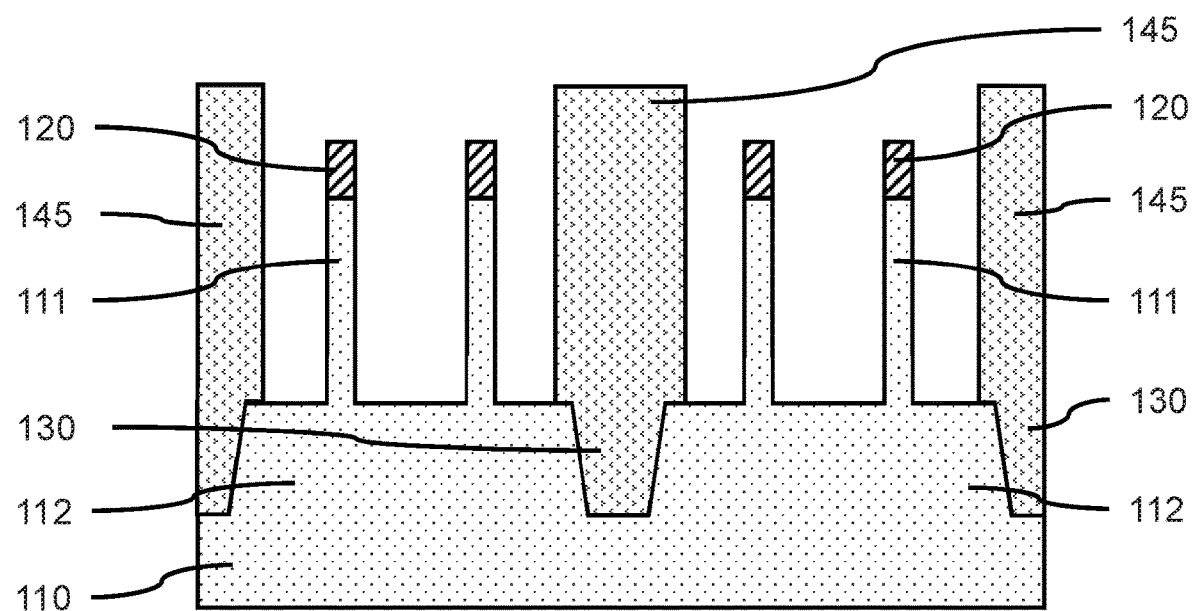
FIG. 3 is a cross-sectional side view showing dielectric pillars formed over isolation trenches after removing portions of the dielectric fill layer, in accordance with an embodiment of the present invention.

FIG. 3 is a cross-sectional side view showing dielectric pillars formed over isolation trenches after removing portions of the dielectric fill layer, in accordance with an embodiment of the present invention.

In various embodiments, the dielectric fill layer 140 can be masked and etched to remove portions of the dielectric fill layer 140 on the vertical fins 111 on the first region 101 and second region 102, where portions of the dielectric fill layer 140 remains to form dielectric pillars 145 over isolation trenches 130. The dielectric pillars 145 and isolation trenches 130 can surround each of the mesas 112, where the dielectric pillars 145 and isolation trenches 130 can electrically isolate devices.

Figure 4:
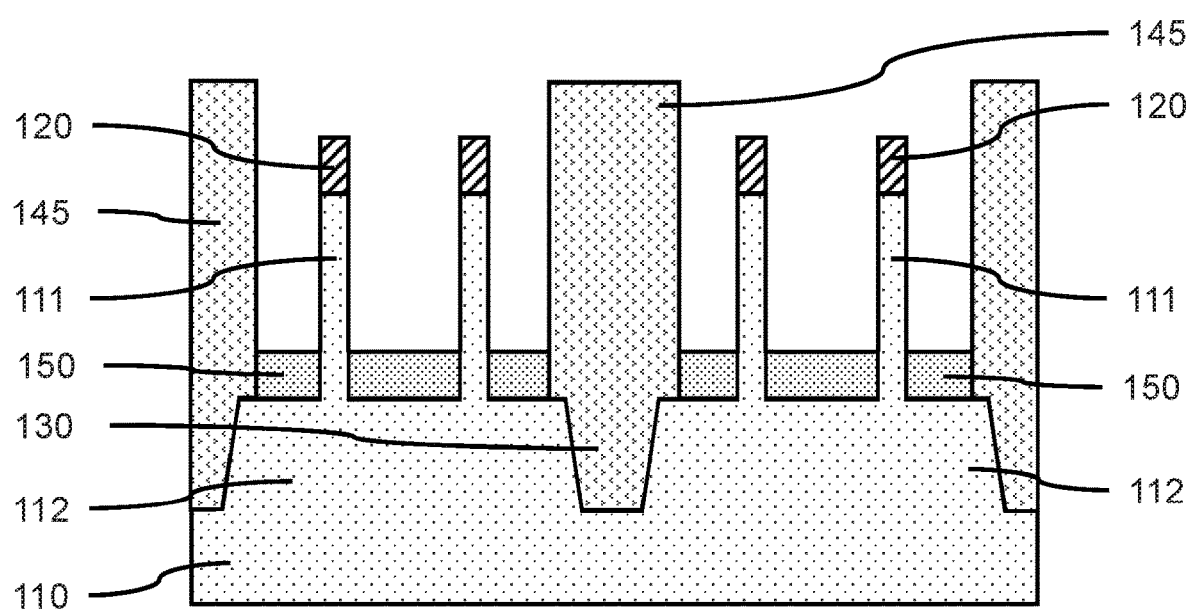
FIG. 4 is a cross-sectional side view showing a bottom source/drain layer formed on the substrate between dielectric pillars and vertical fins, in accordance with an embodiment of the present invention.

FIG. 4 is a cross-sectional side view showing a bottom source/drain layer formed on the substrate between dielectric pillars and vertical fins, in accordance with an embodiment of the present invention.

In one or more embodiments, a bottom source/drain layer 150 can be formed on the mesas 112 between dielectric pillars 145, where the bottom source/drain layer 150 can surround the lower portion of one or more of the vertical fins 111 on the mesa 112. The bottom source/drain layer 150 can be formed by epitaxial growth on the exposed surfaces of the mesas 112. The bottom source/drain layer 150 can be doped with n-type (e.g., phosphorous (P), arsenic (As)) or p-type (e.g., boron (B), gallium (Ga)) dopants, where the dopants can be introduced during epitaxial growth (i.e., in situ) or after epitaxial growth (i.e., ex situ).

In various embodiments, the bottom source/drain layer 150 can be a semiconductor material, including, but not limited to, silicon (Si), silicon-germanium (SiGe), carbon-doped silicon (Si:C), silicon carbide (SiC), and combinations thereof.

Figure 5:
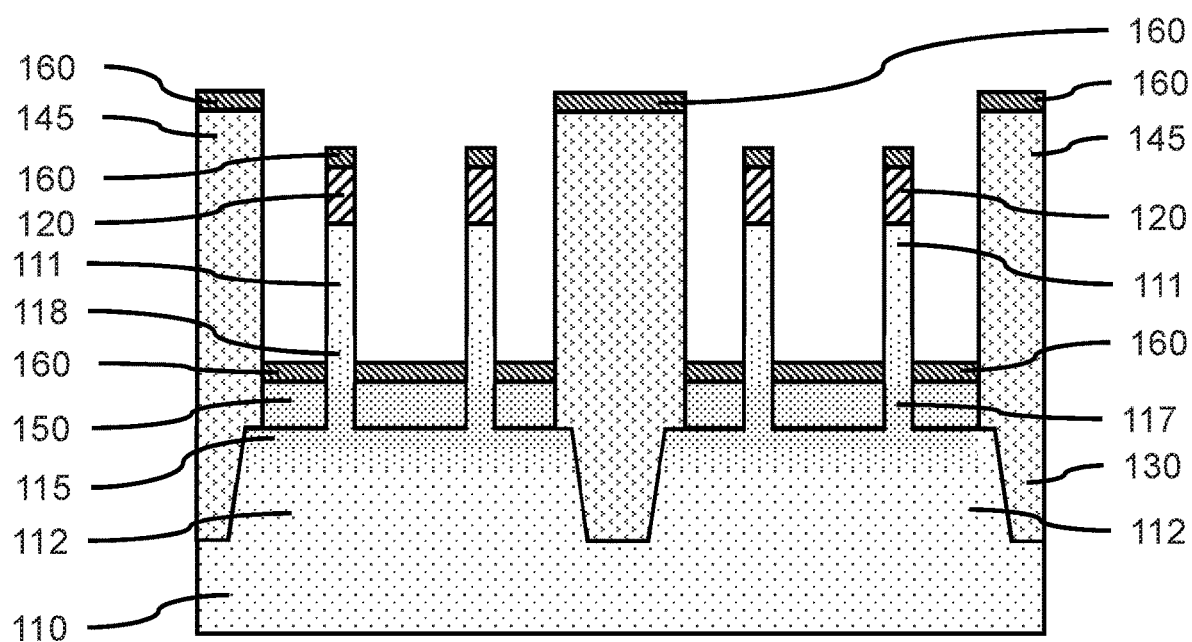
FIG. 5 is a cross-sectional side view showing a bottom spacer layer formed on the bottom source/drain layer, fin templates, and dielectric pillars, in accordance with an embodiment of the present invention.

FIG. 5 is a cross-sectional side view showing a bottom spacer layer formed on the bottom source/drain layer, fin templates, and dielectric pillars, in accordance with an embodiment of the present invention.

In one or more embodiments, a bottom spacer layer 160 can be formed on the bottom source/drain layer 150, fin templates 120, and dielectric pillars 145, where the bottom spacer layer 160 can be formed by a directional deposition, for example, a high density plasma (HDP) deposition or a gas cluster ion beam (GCIB) deposition. The material of the bottom spacer layer 160 can be preferentially formed on surfaces substantially perpendicular to the direction of the deposition, while the surfaces substantially parallel with the direction of deposition can remain essentially uncovered. An isotropic etch, for example a wet chemical etch, or dry plasma etch, can be used to remove extraneous materials from the sidewalls and endwalls of the vertical fins 111, fin templates 120, and dielectric pillars 145.

In one or more embodiments, the bottom spacer layer 160 can be formed to a thickness in the range of about 3 nm to about 15 nm, or about 5 nm to about 10 nm, although other thicknesses are also contemplated.

In various embodiments, the bottom spacer layer 160 can be a dielectric material, including, but not limited to silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof. The material of the bottom spacer layer 160 can allow selective etching relative to the dielectric pillars 145.

Figure 6:
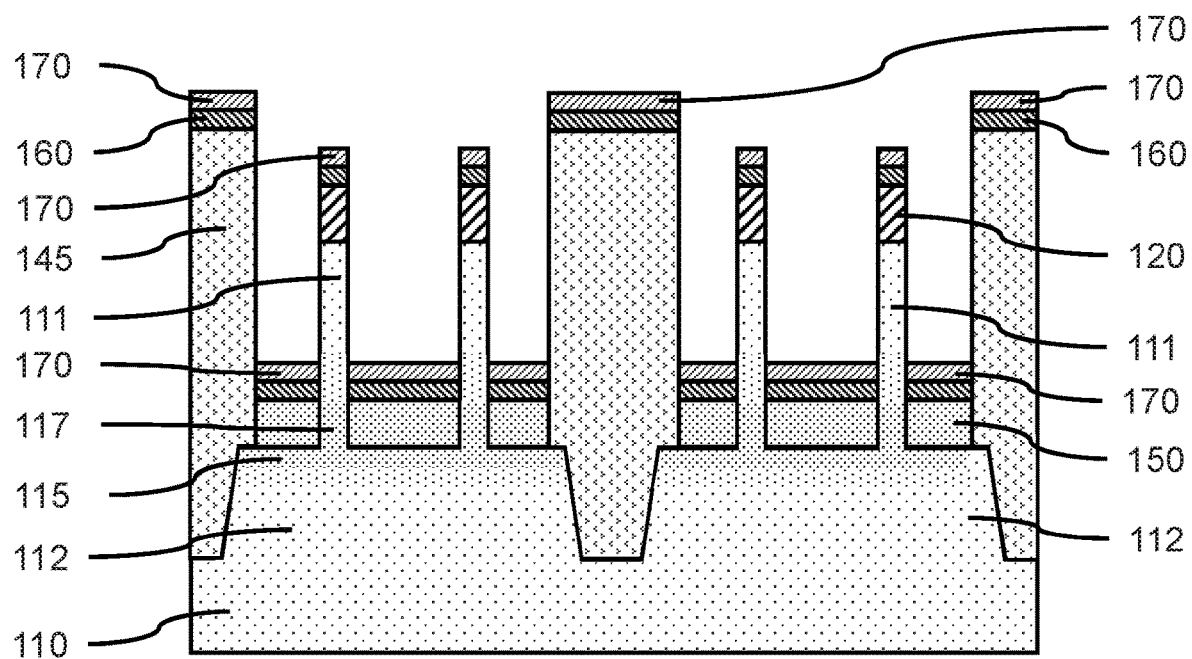
FIG. 6 is a cross-sectional side view showing a filler layer formed on the bottom spacer layer, in accordance with an embodiment of the present invention.

FIG. 6 is a cross-sectional side view showing a filler layer formed on the bottom spacer layer, in accordance with an embodiment of the present invention.

In one or more embodiments, a filler layer 170 can be formed on the bottom spacer layer 160, where the filler layer 170 can be formed by a directional deposition, for example, a high density plasma (HDP) deposition or a gas cluster ion beam (GCIB) deposition. The material of the filler layer 170 can be preferentially formed on surfaces substantially perpendicular to the direction of the deposition, while the surfaces substantially parallel with the direction of deposition can remain essentially uncovered. An isotropic etch, for example a wet chemical etch, or dry plasma etch, can be used to remove extraneous filler layer 170 from the sidewalls and endwalls of the vertical fins 111, fin templates 120, and dielectric pillars 145.

In one or more embodiments, the filler layer 170 can be formed to a thickness in the range of about 2 nm to about 10 nm, or about 2 nm to about 6 nm, although other thicknesses are also contemplated. The thickness of the filler layer 170 can be determined by the predetermined difference in thickness between a thick gate dielectric layer and a thin gate dielectric layer, where the thickness of the filler layer 170 can compensate for the lesser thickness of the thin gate dielectric layer. The filler layer can control the position of a gate structure relative to a source/drain junction.

In various embodiments, the filler layer 170 can be a dielectric material, including, but not limited to silicon oxide (SiO), carbon-doped silicon oxide (SiO:C), silicon oxycarbide (SiOC), silicon nitride (SiN), silicon oxynitride (SiON), silicon carbonitride (SiCN), silicon oxycarbonitride (SiOCN), silicon boro carbonitride (SiBCN), and combinations thereof. The material of the filler layer 170 can allow selective etching relative to the bottom spacer layer 160 and dielectric pillars 145.

In various embodiments, the substrate 110, including the mesas 112, the vertical fins 111, the bottom source/drain layer 150, the bottom spacer layer 160, the filler layer 170, and the dielectric pillars 145 can undergo a heat treatment (e.g., anneal). The heat treatment can cause diffusion of the dopants from the bottom source/drain layer 150 into the adjoining portions of the vertical fins 111 to form doped extension regions 117 in the lower portions of the vertical fins, and the upper region of the mesas 112 to form a doped base region 115.

The location and height of the doped extension regions 117 can determine the source/drain junction with the device channel, and the amount of underlap or overlap between a gate structure and the device channel. In various embodiments, the doped extension regions 117 can have a dopant concentration gradient that decreases from the portion of the vertical fin closest to the mesa surface towards the middle portion of the vertical fin adjacent to the filler layer 170. In various embodiments, a top edge of the doped extension regions 117 can be aligned with a lower edge of a subsequently formed conductive gate fill layer, where the dopant concentration of the doped extension regions 117 adjacent to the lower edge of the conductive gate fill layer can be in a range of about $1 \times 10^{18}$ cm$^{-3}$ to about $1 \times 10^{19}$ cm$^{-3}$, or about $5 \times 10^{18}$ cm$^{-3}$. The source/drain junction can overlap with the conductive gate fill layer if the dopant concentration of the doped extension regions 117 is equal to or greater than about $5 \times 10^{18}$ cm$^{-3}$, and underlapped if the concentration of the doped extension regions 117 is below about $5 \times 10^{18}$ cm$^{-3}$. In various embodiments, the source/drain-channel junctions can have the same locations for both a thin oxide device and thick oxide device, where the junctions are overlapped or underlapped relative to the conductive gate fill layers, and where the overlap or underlap can optimize the subsequently fabricated device.

Figure 7:
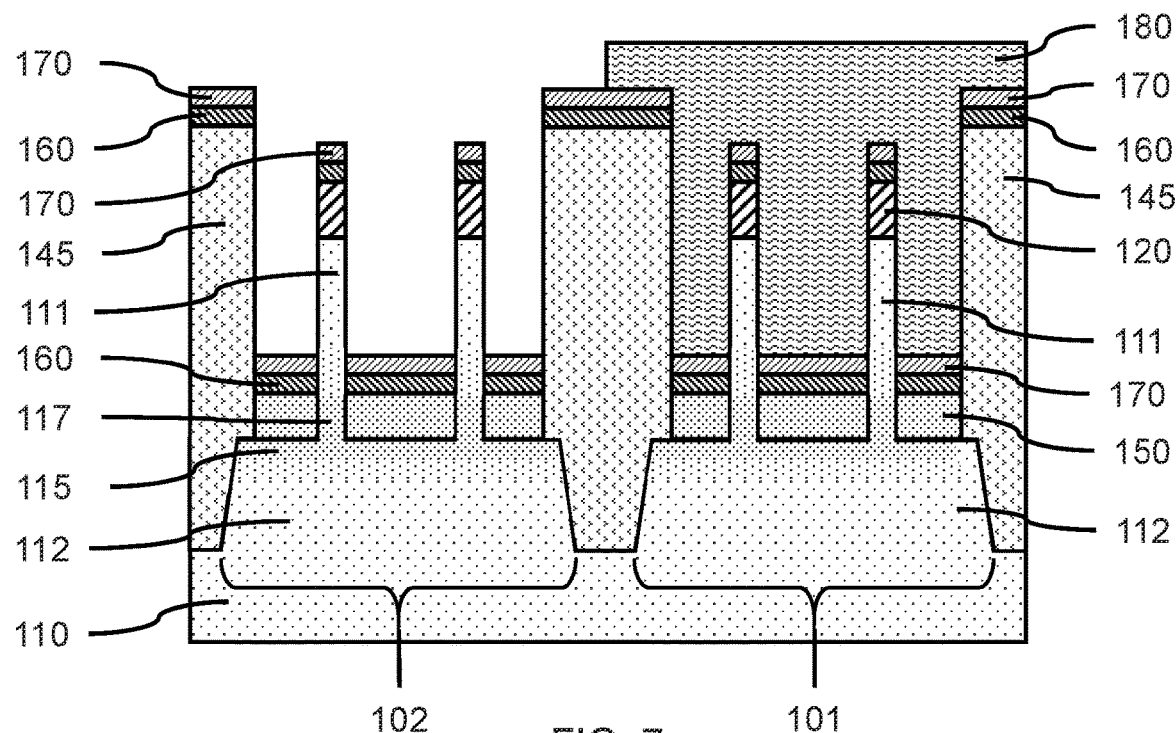
FIG. 7 is a cross-sectional side view showing a cover block on a first subset of the plurality of vertical fins and a portion of the filler layer, in accordance with an embodiment of the present invention.

FIG. 7 is a cross-sectional side view showing a cover block on a first subset of the plurality of vertical fins and a portion of the filler layer, in accordance with an embodiment of the present invention.

In one or more embodiments, a cover block 180 can be formed on a first subset of the plurality of vertical fins 111 and a portion of the filler layer 170 on a first region of the substrate 101. The cover block 180 can be a polymeric material, for example, tetraethyl orthosilicate (TEOS), hydrogen silsesquioxane (HSQ) and methylsilsesquioxane (MSQ), an amorphous carbon (a-C), organic planarization layer (OPL), or combinations thereof. The cover block 180 can be selectively etchable relative to the filler layer 170 and dielectric pillars 145.

The cover block 180 can be formed can be formed by a blanket deposition (e.g., spin-on) of a cover layer, and selective removal of the cover layer from a subset of the vertical fins 111 on a second region 102 of the substrate using lithographic and etching processes.

Figure 8:
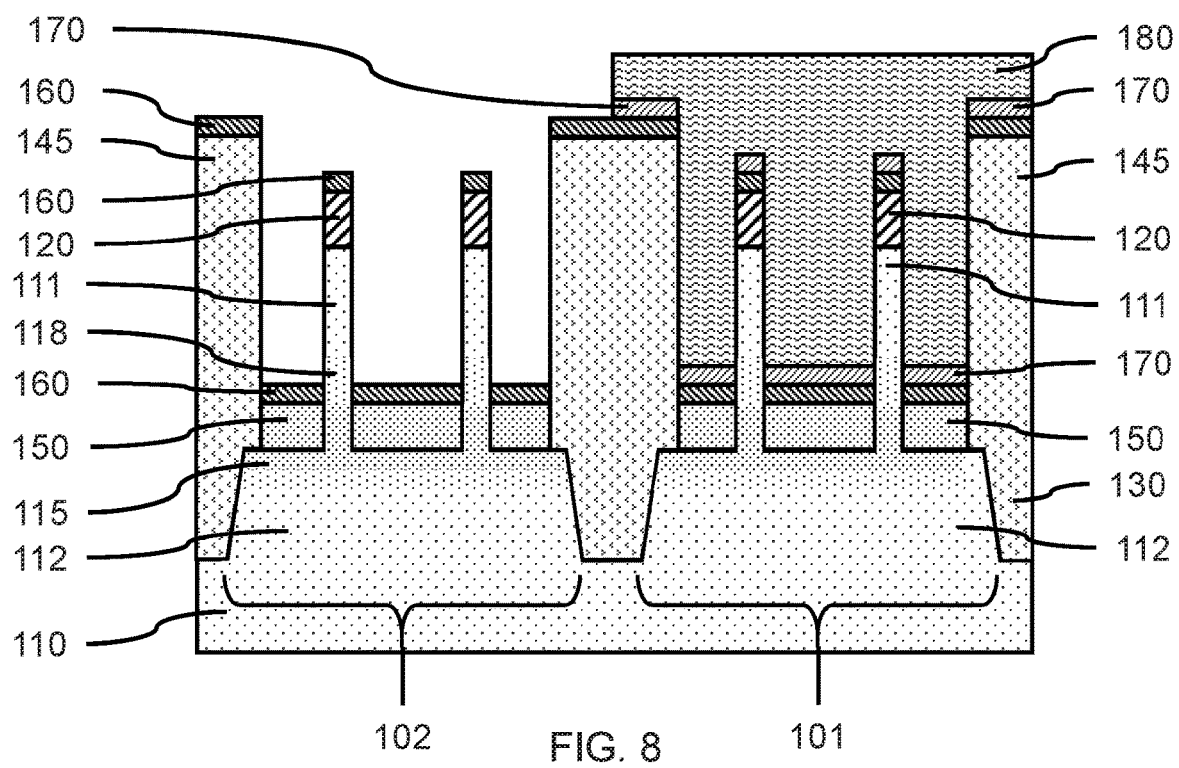
FIG. 8 is a cross-sectional side view showing a portion of the bottom spacer layer exposed after removing the exposed portion of the filler layer, in accordance with an embodiment of the present invention.

FIG. 8 is a cross-sectional side view showing a portion of the bottom spacer layer exposed after removing the exposed portion of the filler layer, in accordance with an embodiment of the present invention.

In one or more embodiments, a portion of the filler layer 170 not covered by the cover block 180 can be removed to expose the underlying portion of the bottom spacer layer 160, where the filler layer 170 can be removed using a selective direction etch (e.g., reactive ion etch (RIE)), an isotropic etch (e.g., wet etch, dry plasma etch), or a combination thereof. A portion of the filler layer 170 on the dielectric pillar 145 between the first subset of vertical fins and the second subset of vertical fins can be covered by the cover block 180, and an exposed portion of the filler layer 170 on the dielectric pillar 145 can be removed.

Removal of the portion of the filler layer 170 can increase the distance from the top surface of the bottom spacer layer 160 to the top(s) of the vertical fin(s) on the second region 102 of the substrate 110. The reduction in overall thickness of the layers and increase in distance can compensate for the thickness of a subsequently formed thick gate dielectric layer. Removal of the filler layer 170 in the second region 102 can also decrease the distance between the bottom source/drain junction and a gate structure, where the junction and gate structure can be aligned.

Figure 9:
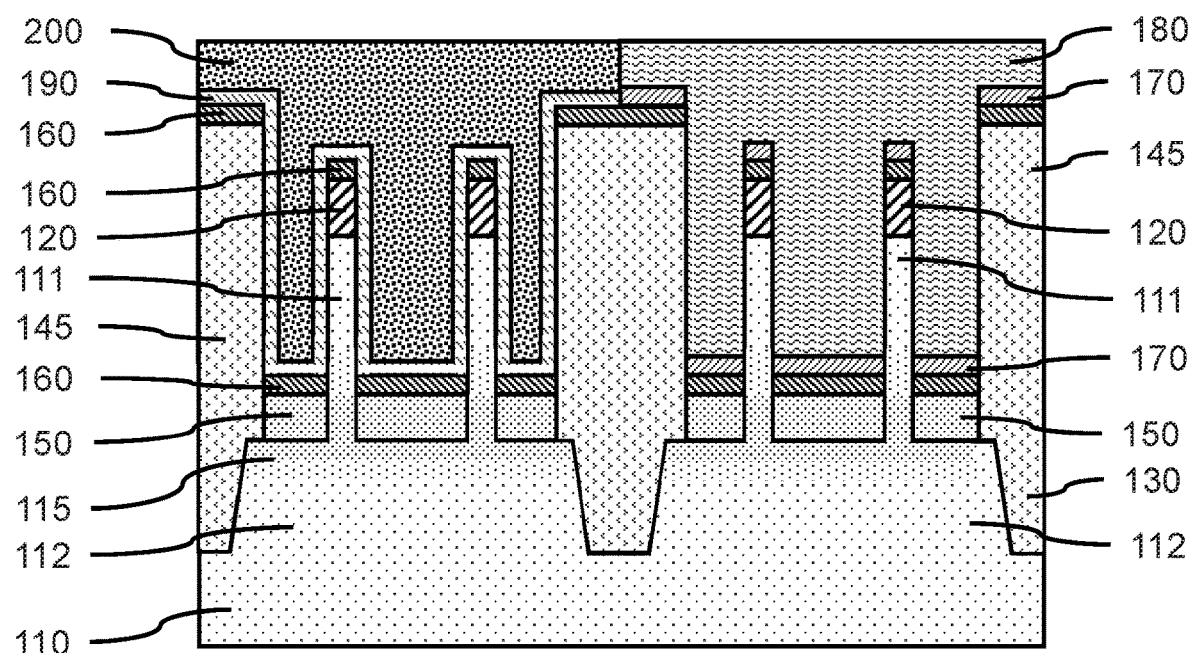
FIG. 9 is a cross-sectional side view showing a gate structure having a thick gate dielectric layer formed on a second subset of the vertical fins and the exposed portion of the bottom spacer layer, in accordance with an embodiment of the present invention.

FIG. 9 is a cross-sectional side view showing a gate structure having a thick gate dielectric layer formed on a second subset of the vertical fins and the exposed portion of the bottom spacer layer, in accordance with an embodiment of the present invention.

In one or more embodiments, a thick gate dielectric layer 190 can be formed on the exposed surfaces of the vertical fins 111, fin templates 120, dielectric pillars 145, and bottom spacer layer 160. The thick gate dielectric layer 190 can be formed by a conformal deposition, for example, atomic layer deposition (ALD) plasma enhanced ALD (PEALD), or a combination thereof.

In various embodiments, the thick gate dielectric layer 190 can have a thickness in the range of about 4 nm to about 12 nm, or about 4 nm to about 8 nm, although other thicknesses are also contemplated. The thickness of the thick gate dielectric layer 190 can be greater than the thickness of the thin gate dielectric layer by about 2 nm to about 6 nm, or about 3 nm to about 5 nm, where a thin gate dielectric layer can be used in logic transistor devices and memory transistor devices, and the thick gate dielectric layer can be used for high voltage and analog devices.

In various embodiments, the thick gate dielectric layer 190 can be an insulating, dielectric material, including, but not limited to, silicon oxide (SiO), silicon nitride (SiN), silicon oxynitride (SiON), a high-K dielectric, or a suitable combination of these materials. The thick gate dielectric layer 190 can be a material different from the bottom spacer layer 160 and filler layer 170.

The high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide (Pb($Sc_xTa_{1-x}$)$O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In various embodiments, a first conductive gate fill layer 200 can be formed on the thick gate dielectric layer 190, where the first conductive gate fill layer 200 can be formed by a blanket deposition, for example, chemical vapor deposition (CVD), plasma enhanced CVD (PECVD), metal-organic CVD (MOCVD), atomic layer deposition (ALD), or a combination thereof. An upper portion of the first conductive gate fill layer 200 extending above the cover layer 180 or thick gate dielectric layer 190 can be removed using a CMP.

In various embodiments, the first conductive gate fill layer 200 can be doped polycrystalline or amorphous silicon, germanium, silicon-germanium, a metal (e.g., tungsten, titanium, tantalum, ruthenium, zirconium, cobalt, copper, aluminum, platinum, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The first conductive gate fill layer 200 may further comprise dopants that are incorporated during or after deposition.

In various embodiments, the cover layer 180 can be removed to expose the remaining portion of the filler layer 170 on the first region 101 of the substrate 110, where the cover layer 180 can be removed using a directional etch, a selective isotropic etch, or a combination thereof.

Figure 10:
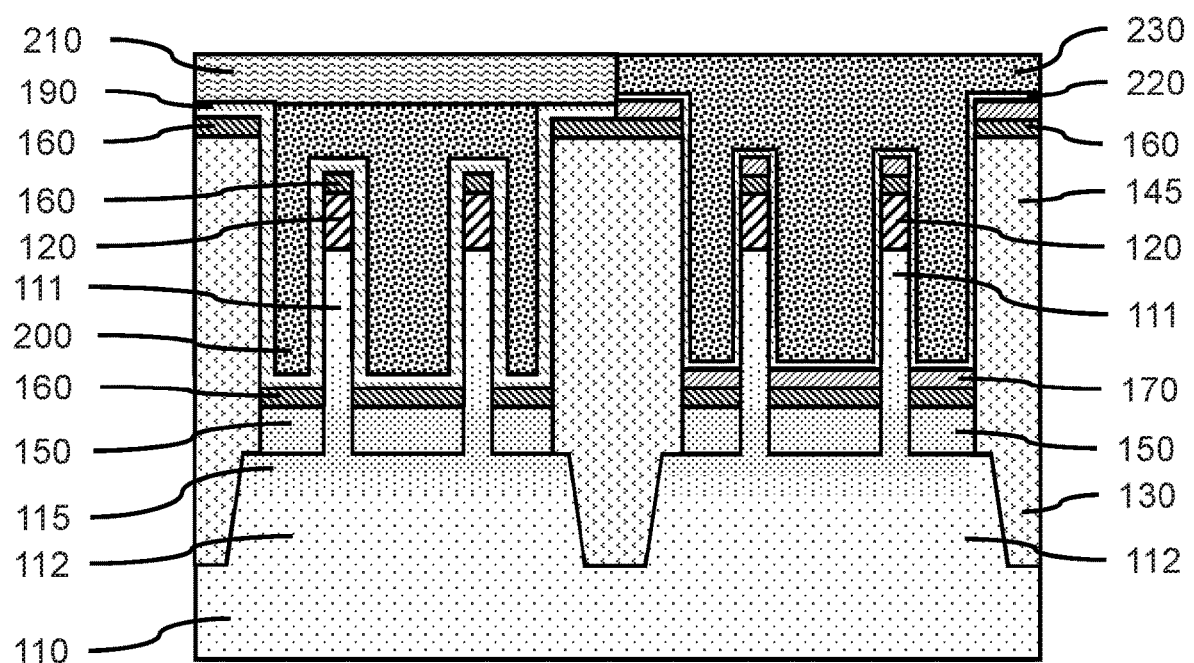
FIG. 10 is a cross-sectional side view showing another gate structure having a thin gate dielectric layer formed on the remaining portion of the filler layer and the first subset of vertical fins, in accordance with an embodiment of the present invention.

FIG. 10 is a cross-sectional side view showing another gate structure having a thin gate dielectric layer formed on the remaining portion of the filler layer and the first subset of vertical fins, in accordance with an embodiment of the present invention.

In various embodiments, a protective slab 210 can be formed on the first conductive gate fill layer 200, thick gate dielectric layer 190, vertical fins 111, fin templates 120, and dielectric pillars 145, where the protective slab 210 can be a polymeric material, for example, tetraethyl orthosilicate (TEOS), hydrogen silsesquioxane (HSQ) and methylsilsesquioxane (MSQ), an amorphous carbon (a-C), organic planarization layer (OPL), or combinations thereof. The protective slab 210 can be formed by a spin-on process. The protective slab 210 can be selectively etchable relative to the thick gate dielectric layer 190 and first conductive gate fill layer 200.

In one or more embodiments, a thin gate dielectric layer 220 can be formed on the exposed surfaces of the vertical fins 111, fin templates 120, dielectric pillars 145, and filler layer 170. The thin gate dielectric layer 220 can be formed by a conformal deposition, for example, atomic layer deposition (ALD) plasma enhanced ALD (PEALD), or a combination thereof.

In various embodiments, the thin gate dielectric layer 220 can have a thickness in the range of about 2 nm to about 10 nm, or about 2 nm to about 6 nm, although other thicknesses are also contemplated. The thickness of the thin gate dielectric layer 220 can be less than the thickness of the thick gate dielectric layer 190 by about 2 nm to about 6 nm, or about 3 nm to about 5 nm, where the thin gate dielectric layer can be used in logic transistor devices and memory transistor devices.

In various embodiments, the thin gate dielectric layer 220 can be an insulating, dielectric material, including, but not limited to, silicon oxide (SiO), silicon nitride (SiN), silicon oxynitride (SiON), a high-K dielectric, or a suitable combination of these materials. The thin gate dielectric layer 220 can be a different material or the same material as the thick gate dielectric layer 190, and a material different from the bottom spacer layer 160 and filler layer 170.

In various embodiments, a second conductive gate fill layer 230 can be formed on the thin gate dielectric layer 220, where the second conductive gate fill layer 230 can be formed by a blanket deposition, for example, chemical vapor deposition (CVD), plasma enhanced CVD (PECVD), metal-organic CVD (MOCVD), atomic layer deposition (ALD), or a combination thereof. An upper portion of the second conductive gate fill layer 230 extending above the protective slab or thin gate dielectric layer 220 can be removed using a CMP.

In various embodiments, the second conductive gate fill layer 230 can be doped polycrystalline or amorphous silicon, germanium, silicon-germanium, a metal (e.g., tungsten, titanium, tantalum, ruthenium, zirconium, cobalt, copper, aluminum, platinum, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The second conductive gate fill layer 230 may further comprise dopants that are incorporated during or after deposition.

In various embodiments, the top surface of the portion of the thin gate dielectric layer 220 directly on the filler layer 170 can be at the same height as the top surface of the portion of the thick gate dielectric layer 190 directly on the bottom spacer layer 160, where the thickness of the filler layer 170 compensates for the difference in thickness between the thin gate dielectric layer 220 and thick gate dielectric layer 190. The source/drain junction(s) of the doped extension regions 117 in the first region 101 can be the same height as the source/drain junction(s) in the second region 102.

Figure 11:
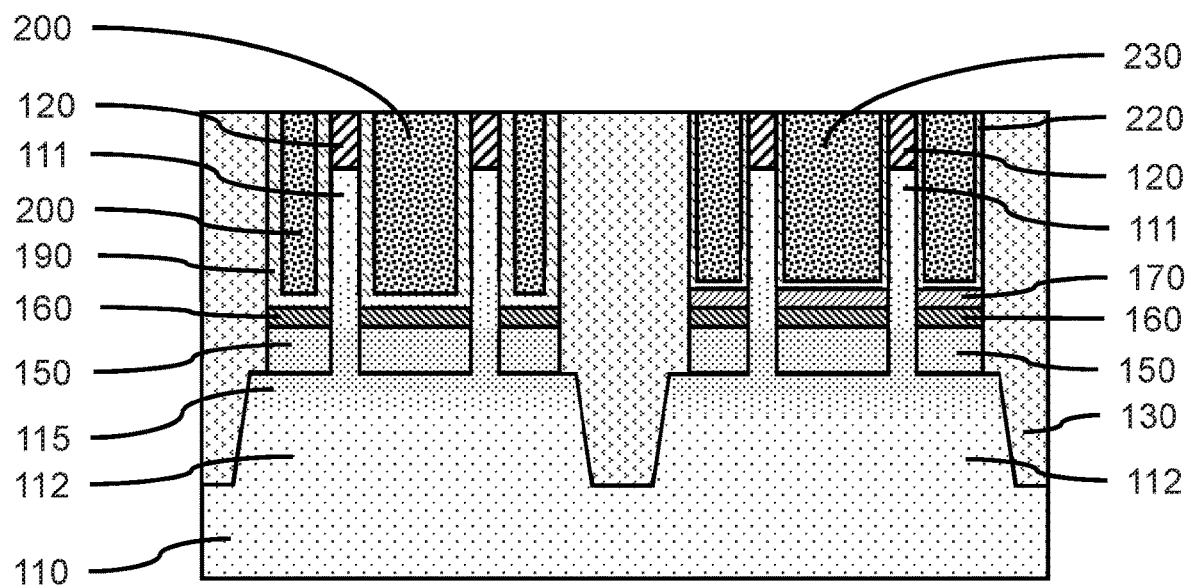
FIG. 11 is a cross-sectional side view showing the gate structure with the thin gate dielectric layer formed on the first subset of vertical fins and the gate structure with the thick gate dielectric layer formed on the second subset of vertical fins after removing portions of the gate fill layer, gate dielectric layers, filler layer, bottom spacer layer, and dielectric pillars, in accordance with an embodiment of the present invention.

FIG. 11 is a cross-sectional side view showing the gate structure with the thin gate dielectric layer formed on the first subset of vertical fins and the gate structure with the thick gate dielectric layer formed on the second subset of vertical fins after removing portions of the gate fill layer, gate dielectric layers, filler layer, bottom spacer layer, and dielectric pillars, in accordance with an embodiment of the present invention.

In one or more embodiments, the protective slab 210 can be removed using CMP or a selective etch to expose the first conductive gate fill layer 200. A CMP can be used to remove portions of the first conductive gate fill layer 200, second conductive gate fill layer 230, filler layer 170, bottom spacer layer 160, thick gate dielectric layer 190, thin gate dielectric layer 220, and dielectric pillars 145 above the top surfaces of the fin templates 120. The CMP can provide a smooth, flat surface for referencing subsequent processes.

Figure 12:
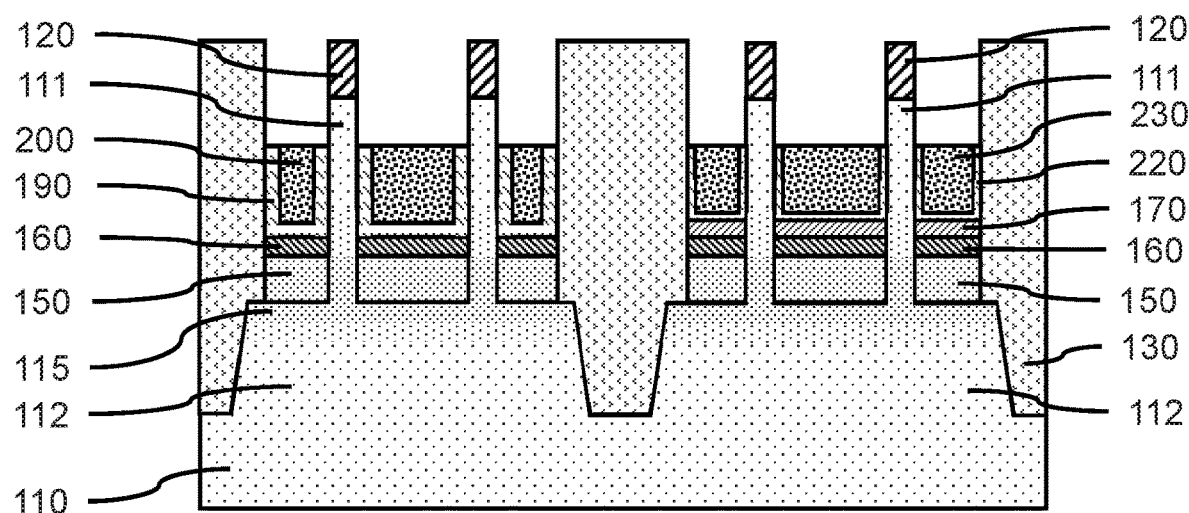
FIG. 12 is a cross-sectional side view showing the thicknesses of the thick gate dielectric layer, thin gate dielectric layer, and gate fill layer reduced to below the top surfaces of the vertical fins, in accordance with an embodiment of the present invention.

FIG. 12 is a cross-sectional side view showing the thicknesses of the thick gate dielectric layer, thin gate dielectric layer, and gate fill layers reduced to below the top surfaces of the vertical fins, in accordance with an embodiment of the present invention.

In one or more embodiments, portions of the first conductive gate fill layer 200 and second conductive gate fill layer 230 can be removed by a selective directional or isotropic etch to reduce the heights of the first conductive gate fill layer 200 and second conductive gate fill layer 230 relative to the sidewalls of vertical fins 111. Portions of the thick gate dielectric layer 190 and thin gate dielectric layer 220 can be exposed by removal of the first conductive gate fill layer 200 and second conductive gate fill layer 230. The exposed portions of the thick gate dielectric layer 190 and thin gate dielectric layer 220 can be removed using a selective isotropic etch to form gate structures on the vertical fins 111 in the first region 101 and second region 102 with the same predetermined gate length.

Figure 13:
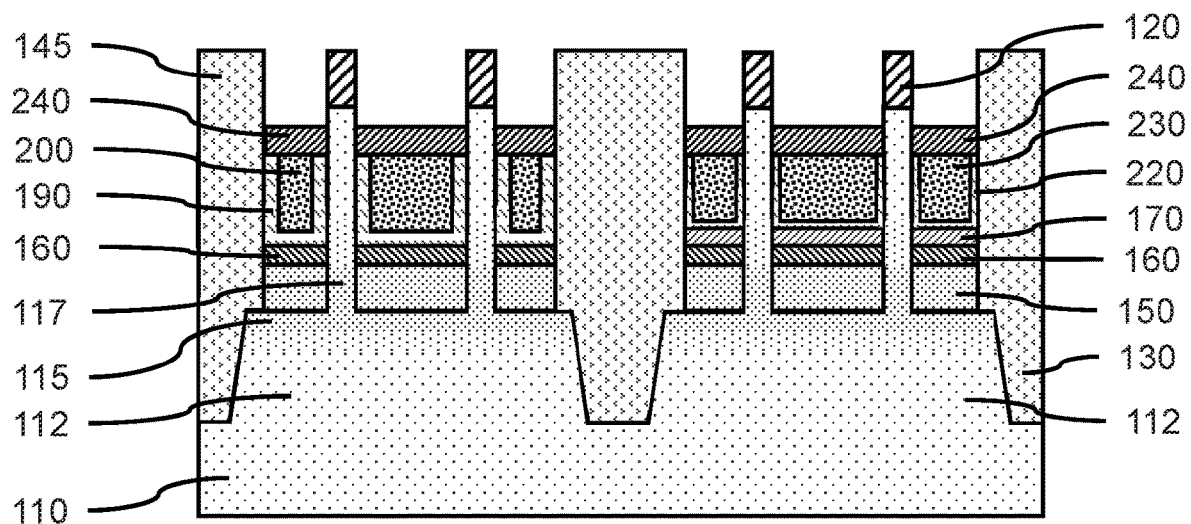
FIG. 13 is a cross-sectional side view showing a top spacer layer formed on the surfaces of the reduced height thick gate dielectric layer, thin gate dielectric layer, and gate fill layer, in accordance with an embodiment of the present invention.

FIG. 13 is a cross-sectional side view showing a top spacer layer formed on the surfaces of the reduced height thick gate dielectric layer, thin gate dielectric layer, and gate fill layers, in accordance with an embodiment of the present invention.

In one or more embodiments, a top spacer layer 240 can be formed on the exposed surfaces of the first conductive gate fill layer 200, thick gate dielectric layer 190, second conductive gate fill layer 230, and thin gate dielectric layer 220, where the top spacer layer 240 can be formed by a directional deposition (e.g., GCIB, HDP).

In one or more embodiments, the top spacer layer 240 can be formed to a thickness in the range of about 3 nm to about 15 nm, or about 5 nm to about 10 nm, although other thicknesses are also contemplated. In various embodiments, upper portions of the vertical fins 111 can extend above the top surface of the top spacer layer 240 to provide surfaces for formation of top source/drains.

In various embodiments, the top spacer layer 240 can be a dielectric material, including, but not limited to silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof.

Figure 14:
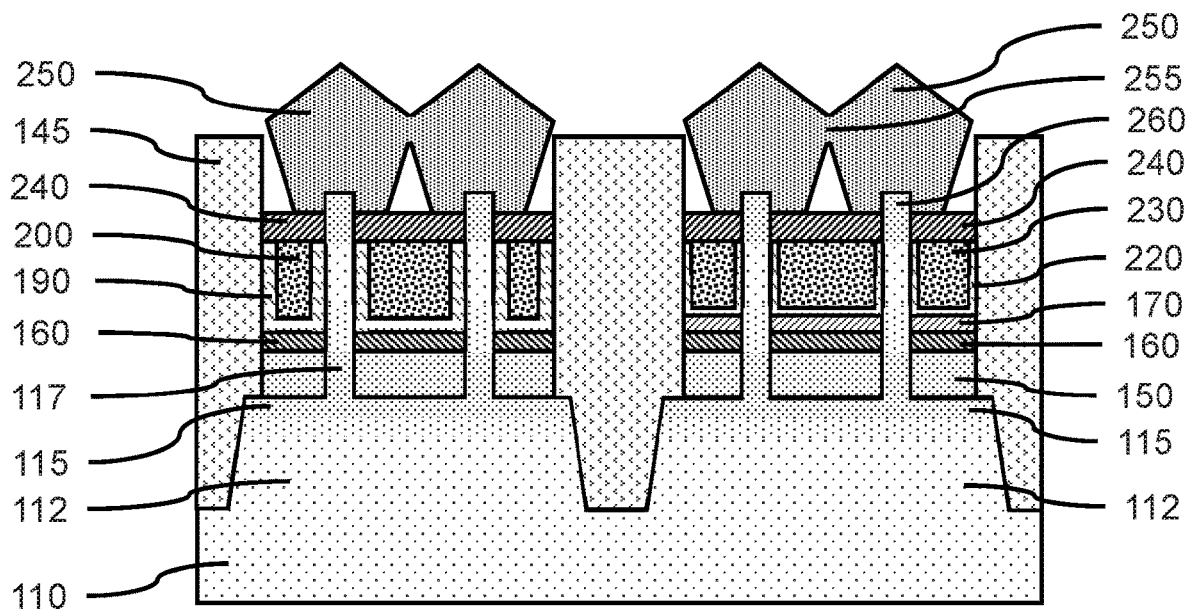
FIG. 14 is a cross-sectional side view showing merged top source/drains formed on the upper portions of the vertical fins exposed above the top spacer layer and separated by a dielectric pillar, in accordance with an embodiment of the present invention.

FIG. 14 is a cross-sectional side view showing merged top source/drains formed on the upper portions of the vertical fins exposed above the top spacer layer and separated by a dielectric pillar, in accordance with an embodiment of the present invention.

In one or more embodiments, a top source/drain 250 can be formed on each of vertical fins 111 in the first region 101, and a top source/drain 250 can be formed on each of vertical fins 111 in the second region 102. In various embodiments, the top source/drains 250 can be formed by epitaxial growth on the surfaces of the vertical fins 111 exposed above the top spacer layer 240. The top source/drains 250 may be grown to a size at which adjacent vertical fins merge into a single merged source/drain with an overlapping source/drain region 255.

In various embodiments, the top source/drains 250 can be doped with n-type (e.g., phosphorous (P), arsenic (As)) or p-type (e.g., boron (B), gallium (Ga)) dopants, where the dopants can be introduced during epitaxial growth (i.e., in situ) or after epitaxial growth (i.e., ex situ). The top extension regions 260 can be doped by dopant diffusion from top source/drains or be doped by an ex-situ method, for example, implantation. The top extension regions 260 can underlap or overlap with the upper source/drain junctions depending on the dopant gradient profiles.

In various embodiments, electrical contacts can be formed to the bottom source/drain layers 160, top source/drains 250, and gate structures to form two or more vertical fin field effect transistor devices with modified spacer thicknesses and gate dielectric thicknesses.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A plurality of fin field effect devices, comprising:
   at least one vertical fin on a first region of a substrate;
   at least one vertical fin on a second region of the substrate;
   a bottom spacer layer on the first region of the substrate and the second region of the substrate;
   a filler layer on the bottom spacer layer on the first region of the substrate;
   a first gate dielectric layer on the bottom spacer layer on the second region of the substrate; and
   a second gate dielectric layer on the filler layer on the first region of the substrate, wherein the first gate dielectric layer is thicker than the second gate dielectric layer.

2. The plurality of fin field effect devices of claim 1, wherein the filler layer has a thickness in a range of about 2 nm to about 10 nm.

3. The plurality of fin field effect devices of claim 2, wherein the second gate dielectric layer has a thickness in a range of about 2 nm to about 10 nm.

4. The plurality of fin field effect devices of claim 3, wherein the first gate dielectric layer has a thickness in a range of about 4 nm to about 12 nm.

5. The plurality of fin field effect devices of claim 3, further comprising a first conductive gate fill layer on the first gate dielectric layer.

6. The plurality of fin field effect devices of claim 5, further comprising a second conductive gate fill layer on the second gate dielectric layer.

7. The plurality of fin field effect devices of claim 6, further comprising a top spacer layer on the first conductive gate fill layer, second conductive gate fill layer, first gate dielectric layer, and second gate dielectric layer.

8. The plurality of fin field effect devices of claim 7, further comprising a top source/drain on each of the vertical fins.

9. The plurality of fin field effect devices of claim 7, wherein the first conductive gate fill layer and the first gate dielectric layer form a first gate structure with the same gate length as a second gate structure formed by the second conductive gate fill layer and the second gate dielectric layer.

10. The plurality of fin field effect devices of claim 9, further comprising a first top source/drain on the at least one vertical fin on the first region of a substrate, and a second top source/drain on the at least one vertical fin on the second region of a substrate.

11. A plurality of fin field effect devices, comprising:
    at least one vertical fin on a first region of a substrate;
    at least one vertical fin on a second region of the substrate;
    a bottom spacer layer on the first region of the substrate and the second region of the substrate;
    a filler layer on the bottom spacer layer on the first region of the substrate;
    a first gate dielectric layer on the bottom spacer layer on the second region of the substrate; and
    a second gate dielectric layer on the filler layer on the first region of the substrate, wherein the first gate dielectric layer is about 2 nm to about 6 nm thicker than the second gate dielectric layer.

12. The plurality of fin field effect devices of claim 11, wherein the second gate dielectric layer has a thickness in a range of about 2 nm to about 10 nm.

13. The plurality of fin field effect devices of claim 12, wherein the first gate dielectric layer has a thickness in a range of about 4 nm to about 12 nm.

14. The plurality of fin field effect devices of claim 13, wherein the filler layer has a thickness in a range of about 2 nm to about 10 nm.

15. A plurality of fin field effect devices, comprising:
at least one vertical fin on a first region of a substrate;
at least one vertical fin on a second region of the substrate;
a bottom spacer layer on the first region of the substrate and the second region of the substrate;
a filler layer on the bottom spacer layer on the first region of the substrate;
a first gate dielectric layer on the bottom spacer layer on the second region of the substrate; and
a second gate dielectric layer on the filler layer on the first region of the substrate, wherein the first gate dielectric layer is thicker than the second gate dielectric layer;
an isolation trench between the first region of the substrate and the second region of the substrate; and
a dielectric pillar on the isolation trench.

16. The plurality of fin field effect devices of claim 15, further comprising a first conductive gate fill layer on the first gate dielectric layer, and a second conductive gate fill layer on the second gate dielectric layer.

17. The plurality of fin field effect devices of claim 16, further comprising a first bottom source/drain layer beneath the at least one vertical fin on the first region of a substrate, and a second bottom source/drain layer beneath the at least one vertical fin on the second region of a substrate.

18. The plurality of fin field effect devices of claim 17, wherein the filler layer is selected from the group of dielectric materials consisting of silicon oxide (SiO), carbon-doped silicon oxide (SiO:C), silicon oxycarbide (SiOC), silicon nitride (SiN), silicon oxynitride (SiON), silicon carbonitride (SiCN), silicon oxycarbonitride (SiOCN), silicon boro carbonitride (SiBCN), and combinations thereof.

19. The plurality of fin field effect devices of claim 18, wherein the bottom spacer layer is selected from the group of materials consisting of silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof.

20. The plurality of fin field effect devices of claim 19, further comprising a first top source/drain on each of the at least one vertical fin on the first region of a substrate, and a second top source/drain on each of the at least one vertical fin on the second region of the substrate.

* * * * *